(12) United States Patent
Kang et al.

(10) Patent No.: US 11,569,193 B2
(45) Date of Patent: Jan. 31, 2023

(54) SEMICONDUCTOR PACKAGE INCLUDING SEMICONDUCTOR CHIPS

(71) Applicant: Samsung Electronics Co., Ltd., Suwon-si (KR)

(72) Inventors: Hyungu Kang, Hwaseong-si (KR); Jaekyu Sung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 17/223,614

(22) Filed: Apr. 6, 2021

(65) Prior Publication Data

US 2022/0130793 A1 Apr. 28, 2022

(30) Foreign Application Priority Data

Oct. 26, 2020 (KR) .......... 10-2020-0139250

(51) Int. Cl.
*H01L 23/00* (2006.01)
*H01L 25/18* (2006.01)
*H01L 23/498* (2006.01)

(52) U.S. Cl.
CPC ........ *H01L 24/73* (2013.01); *H01L 23/49816* (2013.01); *H01L 24/06* (2013.01); *H01L 24/32* (2013.01); *H01L 24/48* (2013.01); *H01L 24/49* (2013.01); *H01L 25/18* (2013.01); *H01L 2224/06102* (2013.01); *H01L 2224/32145* (2013.01); *H01L 2224/32225* (2013.01); *H01L 2224/48148* (2013.01); *H01L 2224/48158* (2013.01); *H01L 2224/49107* (2013.01); *H01L 2224/49109* (2013.01); *H01L 2224/49112* (2013.01); *H01L 2224/73265* (2013.01); *H01L 2924/1431* (2013.01); *H01L 2924/1435* (2013.01); *H01L 2924/182* (2013.01)

(58) Field of Classification Search
CPC ......... H01L 24/73; H01L 24/06; H01L 24/48; H01L 24/49; H01L 25/18; H01L 23/49816
See application file for complete search history.

(56) References Cited

U.S. PATENT DOCUMENTS

| | | | |
|---|---|---|---|
| 7,576,431 B2 | 8/2009 | Takahashi | |
| 9,159,665 B2 | 10/2015 | Pendse | |
| 9,355,969 B2 | 5/2016 | Park | |
| 9,412,720 B2 | 8/2016 | Nam et al. | |

(Continued)

FOREIGN PATENT DOCUMENTS

| | | |
|---|---|---|
| CN | 101582403 A | 11/2009 |
| CN | 101593734 B | 3/2011 |
| JP | 2020181894 A | 11/2020 |

*Primary Examiner* — Marc Anthony Armand
(74) *Attorney, Agent, or Firm* — Muir Patent Law, PLLC

(57) ABSTRACT

A semiconductor package may include a semiconductor chip on a package substrate. The semiconductor package may include a plurality of conductive connections connecting the semiconductor chip to the package substrate may be disposed, a plurality of towers which are apart from one another and each include a plurality of memory chips may be disposed, wherein a lowermost memory chip of each of the plurality of towers overlaps the semiconductor chip from a top-down view. The semiconductor package further includes a plurality of adhesive layers be attached between the lowermost memory chip of each of the plurality of towers and the semiconductor chip.

20 Claims, 7 Drawing Sheets

(56) References Cited

U.S. PATENT DOCUMENTS

| | | | |
|---|---|---|---|
| 9,627,367 | B2 | 4/2017 | Ye et al. |
| 9,633,973 | B2 | 4/2017 | Kim et al. |
| 9,899,347 | B1 | 2/2018 | Mostovoy et al. |
| 10,002,853 | B2 | 6/2018 | Oh |
| 10,262,972 | B2 | 4/2019 | Lee et al. |
| 10,522,507 | B2 | 12/2019 | Ng et al. |
| 10,756,062 | B2 | 8/2020 | Kim et al. |
| 10,872,881 | B2 | 12/2020 | Patten |
| 2005/0139985 | A1 | 6/2005 | Takahashi |
| 2010/0181661 | A1* | 7/2010 | Takemoto ............... H01L 24/73 257/E23.141 |
| 2016/0148918 | A1 | 5/2016 | Ye et al. |
| 2017/0243855 | A1 | 8/2017 | Kim |
| 2020/0075543 | A1 | 3/2020 | Kosaka |
| 2020/0126919 | A1 | 4/2020 | Kang |
| 2020/0294922 | A1* | 9/2020 | Otsuka ................ H01L 25/0652 |

* cited by examiner

SEMICONDUCTOR PACKAGE INCLUDING SEMICONDUCTOR CHIPS

CROSS-REFERENCE TO THE RELATED APPLICATION

This non-provisional patent application claims priority to Korean Patent Application No. 10-2020-0139250, filed on Oct. 26, 2020, in the Korean Intellectual Property Office, the disclosure of which is incorporated herein by reference in its entirety.

BACKGROUND

1. Field

The inventive concept relates to a semiconductor package including a plurality of semiconductor chips and a method of manufacturing the semiconductor package.

2. Description of the Related Art

Various semiconductor packages equipped with a plurality of semiconductor chips are being researched. A size of each semiconductor package may be standardized based on industry standard. As the number of semiconductor chips equipped in semiconductor packages having a limited size increases, it is easy to increase the degree of integration and an operating speed.

SUMMARY

The exemplary embodiments of the disclosure provide a semiconductor package equipped with a plurality of semiconductor chips and a method of manufacturing the semiconductor package.

A semiconductor package in accordance with an embodiment of the disclosure may include a semiconductor chip on a package substrate. The semiconductor package may additionally include a plurality of first conductive connections connecting the semiconductor chip to the package substrate, a first spacer and a second spacer on the package substrate, each of the first spacer and the second spacer horizontally spaced apart from the semiconductor chip, and a first tower and a second tower. Each of the first tower and second tower includes a plurality of memory chips, a first memory chip disposed at a lowermost end of the first tower and vertically overlapping the semiconductor chip and the first spacer from a top-down view, and a second memory chip disposed at a lowermost end of the second tower and vertically overlapping the semiconductor chip and the second spacer from a top-down view. The semiconductor package may further include a plurality of first adhesive layers. The plurality of first adhesive layers includes an adhesive layer attached between the first memory chip and the semiconductor chip, an adhesive layer attached between the first memory chip and the first spacer, an adhesive layer attached between the second memory chip and the semiconductor chip, and an adhesive layer attached between the second memory chip and the second spacer.

A semiconductor package in accordance with an embodiment of the disclosure may include a semiconductor chip on a package substrate. The semiconductor package may include a plurality of conductive connections connecting the semiconductor chip to the package substrate may be disposed, a plurality of towers which are apart from one another and each include a plurality of memory chips may be disposed, wherein a lowermost memory chip of each of the plurality of towers overlaps the semiconductor chip from a top-down view. The semiconductor package further includes a plurality of adhesive layers be attached between the lowermost memory chip of each of the plurality of towers and the semiconductor chip.

A semiconductor package in accordance with an embodiment of the disclosure may include a first semiconductor chip, a second semiconductor chip, and a third semiconductor chip on a package substrate and horizontally spaced apart from each other. The semiconductor package may include a plurality of first conductive connections connecting the first to third semiconductor chips to the package substrate, and a first tower and a second tower each including a plurality of memory chips. A first memory chip disposed at a lowermost end of the first tower may overlap the first semiconductor chip and the second semiconductor chip from a top-down view. A second memory chip disposed at a lowermost end of the second tower may overlap the first semiconductor chip and the third semiconductor chip from a top-down view. A plurality of first adhesive layers may be attached respectively between the first memory chip and the first semiconductor chip, between the first memory chip and the second semiconductor chip, between the second memory chip and the first semiconductor chip, and between the second memory chip and the third semiconductor chip.

DETAILED DESCRIPTION OF EXEMPLARY EMBODIMENTS

Figure 1:
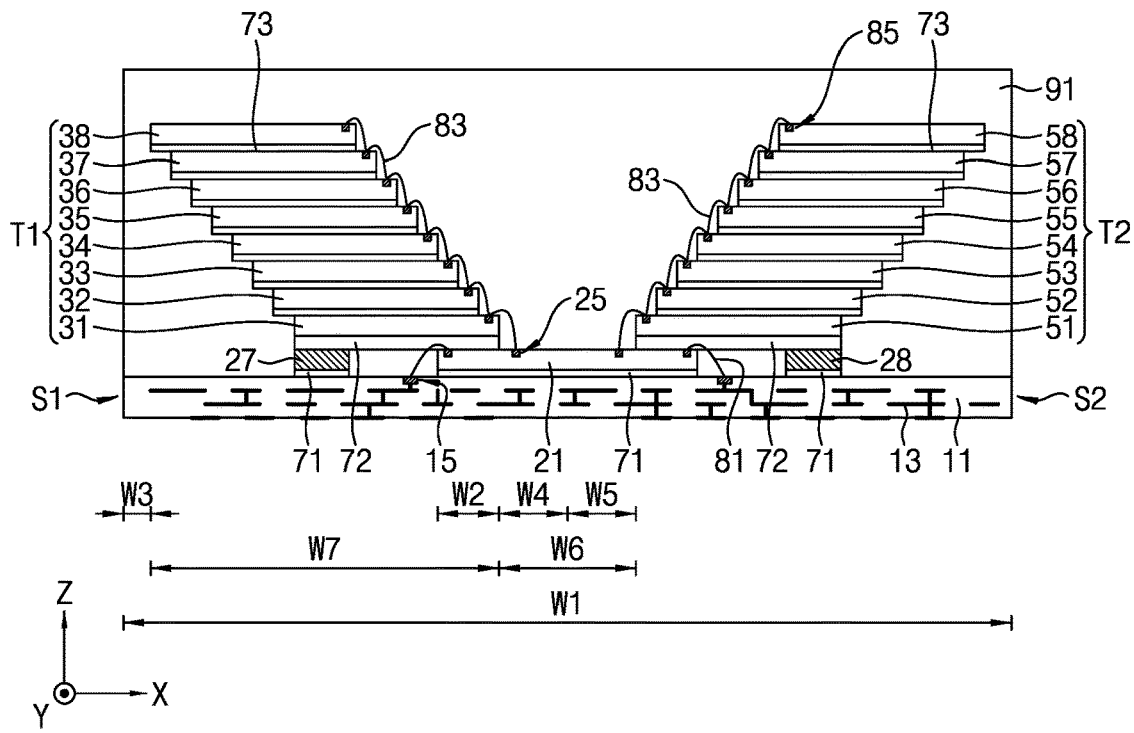
FIG. 1 is a cross-sectional view for describing a semiconductor package according to embodiments of the disclosure.

FIG. 1 is a cross-sectional view for describing a semiconductor package according to embodiments of the disclosure. The semiconductor package according to embodiments of the disclosure may include a Dolmen-like structure (e.g., in reverse).

Referring to FIG. 1, the semiconductor package according to embodiments of the disclosure may include a package substrate 11, a first semiconductor chip 21, a first spacer 27, a second spacer 28, a plurality of main memory chips 31 to 38 and 51 to 58, a plurality of substrate adhesive layers 71, a plurality of first adhesive layers 72, a plurality of second adhesive layers 73, a plurality of first conductive connections 81, a plurality of second conductive connections 83, and an encapsulant 91.

The semiconductor package may include a first side surface S1 and a second side surface S2 opposite to the first side surface S1. The first side surface S1 and the second side surface S2 may be determined based on the package substrate 11 and/or the encapsulant 91. In an embodiment, the package substrate 11 and the encapsulant 91 may be exposed at the first side surface S1 and the second side surface S2. Side surfaces of the package substrate 11 and the encapsulant 91 may be substantially coplanar with each other. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

The package substrate 11 may include a plurality of substrate wirings 13 and a plurality of substrate pads 15. The first semiconductor chip 21 may include a plurality of first pads 25.

For convenience of description, the plurality of main memory chips 31 to 38 and 51 to 58 may be respectively referred to as a first memory chip 31, a second memory chip 32, a third memory chip 33, a fourth memory chip 34, a fifth memory chip 35, a sixth memory chip 36, a seventh memory chip 37, an eighth memory chip 38, a twenty-first memory chip 51, a twenty-second memory chip 52, a twenty-third memory chip 53, a twenty-fourth memory chip 54, a twenty-fifth memory chip 55, a twenty-sixth memory chip 56, a twenty-seventh memory chip 57, and a twenty-eighth memory chip 58. The first memory chip 31, the second memory chip 32, the third memory chip 33, the fourth memory chip 34, the fifth memory chip 35, the sixth memory chip 36, the seventh memory chip 37, and the eighth memory chip 38 may configure a first tower T1. The twenty-first memory chip 51, the twenty-second memory chip 52, the twenty-third memory chip 53, the twenty-fourth memory chip 54, the twenty-fifth memory chip 55, the twenty-sixth memory chip 56, the twenty-seventh memory chip 57, and the twenty-eighth memory chip 58 may configure a second tower T2. As is readily apparent, ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). In particular, with regard to the stacks of memory chips discussed herein, terms such as "twenty-first," "thirty-first," etc., are meant only as labels. In the context of stacked chips, to designate a position within a stack of chips, a term such as "-positioned" will be used—e.g., a first-positioned memory chip from the bottom of a stack of memory chips, a third-positioned memory chip from a top of the stack of memory chips, a last-positioned memory chip from the bottom of a stack of memory chips, etc.

Though eight main memory chips are shown in each stack in FIG. 1, the plurality of main memory chips 31 to 38 and 51 to 58 may include two or more or a various number of memory chips, based on technical limitations. Each of the plurality of main memory chips 31 to 38 and 51 to 58 may include a plurality of second pads 85.

Figure 2:
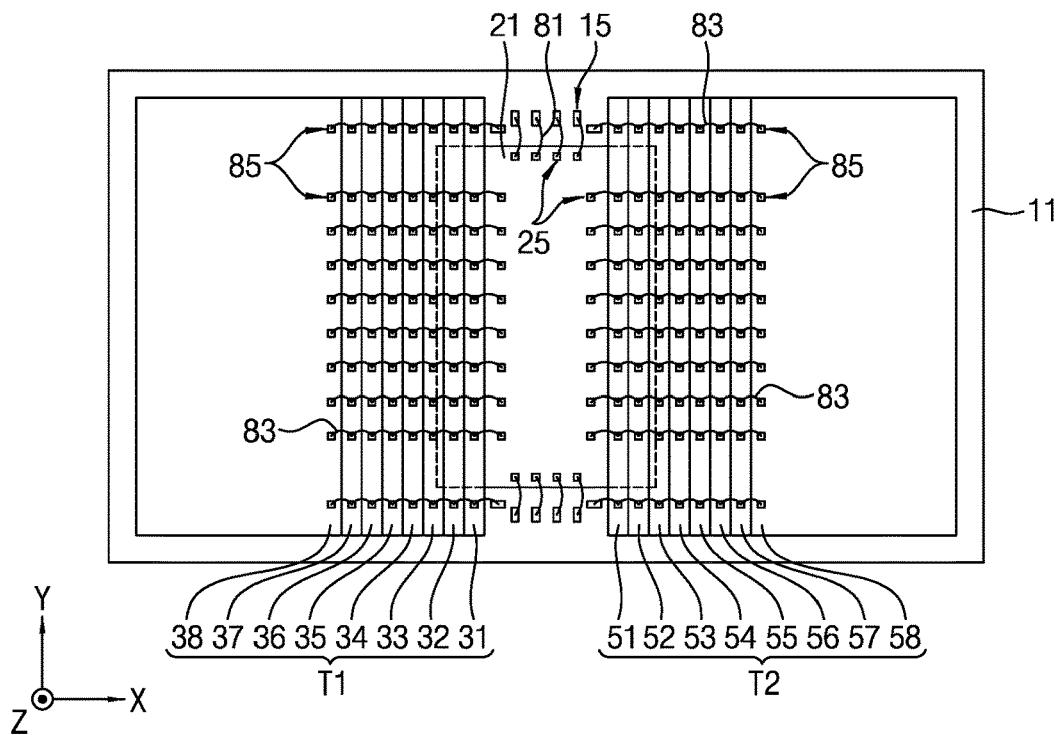
FIG. 2 is a layout for describing a semiconductor package according to embodiments of the disclosure.

FIG. 2 is a layout for describing a semiconductor package according to embodiments of the disclosure.

Referring to FIG. 2, the semiconductor package according to embodiments of the disclosure may include a package substrate 11, a first semiconductor chip 21, a plurality of main memory chips 31 to 38 and 51 to 58, a plurality of first conductive connections 81, and a plurality of second conductive connections 83.

The package substrate 11 may include a plurality of substrate pads 15 (e.g., package substrate pads). The first semiconductor chip 21 may include a plurality of first pads 25 (e.g., chip pads). A first memory chip 31, a second memory chip 32, a third memory chip 33, a fourth memory chip 34, a fifth memory chip 35, a sixth memory chip 36, a seventh memory chip 37, and an eighth memory chip 38 may form a first tower T1. A twenty-first memory chip 51, a twenty-second memory chip 52, a twenty-third memory chip 53, a twenty-fourth memory chip 54, a twenty-fifth memory chip 55, a twenty-sixth memory chip 56, a twenty-seventh memory chip 57, and a twenty-eighth memory chip 58 may form a second tower T2. Each of the first tower T1 and second tower T2 may have an angled orientation, with respect to a top surface of the package substrate 11. Each of the plurality of main memory chips 31 to 38 and 51 to 58 may include a plurality of second pads 85 (e.g., chip pads). Each of the plurality of main memory chips 31 to 38 and 51 to 58 may include an integrated circuit, including a memory cell array, formed on a semiconductor die formed from a wafer.

Referring again to FIGS. 1 and 2, the package substrate 11 may include a rigid printed circuit board (PCB), a flexible PCB, or a rigid-flexible PCB. The package substrate 11 may be a multi-layer PCB. The plurality of substrate wirings 13 may be formed on inner portions and surfaces of the package substrate 11. The plurality of substrate pads 15 may be formed on a top surface of the package substrate 11. The plurality of substrate pads 15 may include a finger electrode or a finger pad. The plurality of substrate wirings 13 and the plurality of substrate pads 15 may each include or be formed of a conductive material such as copper (Cu), aluminum (Al), tungsten (W), or a combination thereof. The plurality of substrate pads 15 may be electrically connected to the plurality of substrate wirings 13, and may be formed at an external surface of the package substrate 11 to connect between the plurality of substrate wirings 13 and the main memory chips.

Each of the first semiconductor chip 21, the first spacer 27, and the second spacer 28 may be disposed on the package substrate 11. The plurality of substrate adhesive layers 71 may be attached between the first semiconductor chip 21 and the package substrate 11, between the first spacer 27 and the package substrate 11, and between the second spacer 28 and the package substrate 11. The plurality of substrate adhesive layers 71 may include an underfill, an adhesive film, a direct adhesive film (DAF), a film over wire (FOW), or a combination thereof. In some embodiments, all of the first semiconductor chip 21, the first spacer 27, and the second spacer 28 have the same material for their respective substrate adhesive layer 71. In other embodiments, at least one of the first semiconductor chip 21, the first spacer 27, and the second spacer 28 have different material from the other two for their respective substrate adhesive layer 71. Each of the first spacer 27 and the second spacer 28 may have substantially the same vertical thickness as that of the first semiconductor chip 21. Top surfaces of the first semiconductor chip 21, the first spacer 27, and the second spacer 28 may be substantially coplanar with one another.

The first semiconductor chip 21 may include an integrated circuit formed on a semiconductor die formed from a wafer, and may include a buffer chip, an interposer chip, a controller chip, a logic chip, or a combination thereof. In an embodiment, the first semiconductor chip 21 may include a memory having an operating speed which is relatively faster than that of each of the plurality of main memory chips 31 to 38 and 51 to 58. For example, the first semiconductor chip 21 may include a buffer memory device having an operating speed which is relatively faster than that of each of the plurality of main memory chips 31 to 38 and 51 to 58, like static random access memory (SRAM), dynamic random access memory (DRAM), or a combination thereof. The first semiconductor chip 21 may include a volatile memory device, a non-volatile memory device, or a combination thereof. The plurality of first pads 25 may be formed on one surface of the first semiconductor chip 21. The plurality of first pads 25 may include or be formed of a conductive material such as Cu, Al, W, or a combination thereof.

Each of the first spacer 27 and the second spacer 28 may include a dummy block, such as a dummy chip, having substantially the same vertical thickness as that of the first semiconductor chip 21. The dummy block or dummy chip may perform no electrical communication function, but may rather serve as a physical support structure. In an embodiment, each of the first spacer 27 and the second spacer 28 may include a PCB, a metal plate, a plastic plate, or a semiconductor substrate. Each of the first spacer 27 and second spacer 28 may be described as a support block, or support post. A "block" as used in this physical sense refers to a three-dimensional structure having substantially flat top and bottom surfaces and having rigidity to support a structure formed thereon.

A center of the first semiconductor chip 21 may be aligned adjacent to a center of the package substrate 11. In an embodiment, the center of the first semiconductor chip 21 may be vertically aligned (e.g., from a top-down view) with respect to the center of the package substrate 11. The first spacer 27 may be disposed between the first semiconductor chip 21 and the first side surface S1. The second spacer 28 may be disposed between the first semiconductor chip 21 and the second side surface S2.

The plurality of first conductive connections 81 may be disposed between the first semiconductor chip 21 and the package substrate 11. The plurality of first conductive connections 81 may each contact a respective one of the plurality of first pads 25 and the plurality of substrate pads 15. The first semiconductor chip 21 may be electrically connected to the package substrate 11 via the plurality of first pads 25, the plurality of first conductive connections 81, and the plurality of substrate pads 15. The plurality of first conductive connections 81 may include a bonding wire, a beam lead, a conductive tape, a conductive spacer, a through substrate via (e.g., through silicon via), a solder ball, a solder bump, or a combination thereof. For example, in some embodiments, all of the first conductive connections 81 are bonding wires. In other embodiments, each of the first conductive connections 81 include a through substrate via and a solder bump or solder ball connected to the through substrate via. In an embodiment, the plurality of first conductive connections 81 may include a bonding wire such as a gold (Au) wire or an Al wire.

The first tower T1 and the second tower T2 apart from each other may be disposed on the first semiconductor chip 21. The second tower T2 may be disposed to be opposite to the first tower T1, e.g., with respect to a center of the first semiconductor chip 21. At least a portion of the first tower T1 may overlap the first semiconductor chip 21 from a top-down view. The first tower T1 may overlap the first semiconductor chip 21 and the first spacer 27 from a top-down view. At least a portion of the second tower T2 may overlap the first semiconductor chip 21 from a top-down view. The second tower T2 may overlap the first semiconductor chip 21 and the second spacer 28 from a top-down view. In some embodiments, in a direction extending between the first spacer 27, the first semiconductor chip 21 and the second spacer 28, the first tower T1, also described as a first stack of chips, may have a center of gravity that aligns with a center of the first spacer 27, or that is between the center of the first spacer 27 and the center of the first semiconductor chip 21. Similarly, in a direction extending between the first spacer 27, the first semiconductor chip 21 and the second spacer 28, the second tower T2, also described as a second stack of chips, may have a center of gravity that aligns with a center of the second spacer 28, or that is between the center of the second spacer 28 and the center of the first semiconductor chip 21.

The first memory chip 31 may be disposed at a lowermost end of the first tower T1. The first memory chip 31 may be referred to as a lowermost main memory chip of the first tower T1. The first memory chip 31, and therefore the first tower T1, may overhang the first semiconductor chip 21, so that a bottom surface of the first memory chip 31 and bottom-most surface of the first tower T1 extends beyond an edge (e.g., an outermost edge) of a top surface of the first semiconductor chip 21. The twenty-first memory chip 51 may be disposed at a lowermost end of the second tower T2. The twenty-first memory chip 51 may be referred to as a lowermost main memory chip of the second tower T2. The twenty-first memory chip 51, and therefore the second tower T2, may overhang the first semiconductor chip 21, so that a bottom surface of the twenty-first memory chip 31 and bottom-most surface of the second tower T2 extends beyond an edge (e.g., an outermost edge) of a top surface of the first semiconductor chip 21. The eighth memory chip 38 may be disposed at an uppermost end of the first tower T1. The eighth memory chip 38 may be referred to as an uppermost main memory chip of the first tower T1. The twenty-eighth memory chip 58 may be disposed at an uppermost end of the second tower T2. The twenty-eighth memory chip 58 may be referred to as an uppermost main memory chip of the second tower T2.

A side surface of the first memory chip 31 may be aligned vertically, from a top-down view, with a side surface of the first spacer 27. The side surface of the first memory chip 31 and the side surface of the first spacer 27 may be substantially coplanar with each other. A side surface of the twenty-eighth memory chip 58 may be aligned vertically, from a top-down view, with a side surface of the second spacer 28. The side surface of the twenty-eighth memory chip 58 and the side surface of the second spacer 28 may be substantially coplanar with each other.

The plurality of first adhesive layers 72 may be disposed between the first memory chip 31 and the first semiconductor chip 21 and between the twenty-first memory chip 51 and the first semiconductor chip 21. One first adhesive layer 72 selected from among the plurality of first adhesive layers 72 may be attached between the first memory chip 31 and the first semiconductor chip 21 and may extend to or may also be formed in a region between the first memory chip 31 and the first spacer 27. For example, an adhesive layer may be formed between the first memory chip 31 and the first semiconductor chip 21, and an adhesive layer may be formed between the first memory chip 31 and the first spacer 27. These two adhesive layers may be part of the same continuous adhesive layer, or may be separated from each other. One other first adhesive layer 72 selected from among the plurality of first adhesive layers 72 may be attached between the twenty-first memory chip 51 and the first semiconductor chip 21 and may extend to or may also be formed in a region between the twenty-first memory chip 51 and the second spacer 28. For example, an adhesive layer may be formed between the twenty-first memory chip 51 and the first semiconductor chip 21, and an adhesive layer may be formed between the twenty-first memory chip 51 and the second spacer 28. These two adhesive layers may be part of the same continuous adhesive layer, or may be separated from each other.

The plurality of first adhesive layers 72 may include a DAF or an FOW. Some of the plurality of first conductive connections 81 may extend to inner portions of the plurality of first adhesive layers 72. Some of the plurality of first conductive connections 81 may partially pass through the plurality of first adhesive layers 72. Each of the plurality of first adhesive layers 72 may have a vertical thickness which is relatively greater than that of each of the plurality of second adhesive layers 73.

Each of the plurality of main memory chips 31 to 38 and 51 to 58 may include a non-volatile memory device, a volatile memory device, or a combination thereof. Each of the plurality of main memory chips 31 to 38 and 51 to 58 may include NAND flash memory, magnetoresistive random access memory (MRAM), phase-change random access memory (PRAM), ferroelectric random access memory (FeRAM), resistive random access memory (RRAM), X-point random access memory (X-point RAM), or a combination thereof. Each of the plurality of main memory chips 31 to 38 and 51 to 58 may include DRAM, SRAM, or a combination thereof.

The plurality of second pads 85 may be respectively formed on first surfaces of the plurality of main memory chips 31 to 38 and 51 to 58. The plurality of second pads 85 may include or be formed of a conductive material such as Cu, Al, W, or a combination thereof. The first to eighth memory chips 31 to 38 may be sequentially stacked. In an embodiment, the first to eighth memory chips 31 to 38 may be offset-aligned sequentially in a direction toward the first side surface S1. For example, the first to eighth memory chips 31 to 38 may be stacked in a cascade structure, or staircase structure, to extend in an upward staircase manner in a direction toward the first side surface S1.

The twenty-first to twenty-eighth memory chips 51 to 58 may be sequentially stacked. In an embodiment, the twenty-first to twenty-eighth memory chips 51 to 58 may be offset-aligned sequentially in a direction toward the second side surface S2. The twenty-first to twenty-eighth memory chips 51 to 58 may be offset-aligned in a direction opposite to the first to eighth memory chips 31 to 38, for example in a mirror structure orientation. For example, the twenty-first to twenty-eighth memory chips 51 to 58 may be stacked in a cascade structure, or staircase structure, to extend in an upward staircase manner in a direction toward the second side surface S2. In an embodiment, an interval between the first to eighth memory chips 31 to 38 and the twenty-first to twenty-eighth memory chips 51 to 58 may increase in a direction distancing away from the first semiconductor chip 21. For example, a distance between the second memory chip 32 and the twenty-second memory chip 52 may be greater than a distance between the first memory chip 31 and the twenty-first memory chip 51, and respective distances between chips on the same vertical level between the stacks may increase in a direction away from the first semiconductor chip 21.

The plurality of second adhesive layers 73 may be respectively attached between each memory chip of the first to eighth memory chips 31 to 38 and between each chip of the twenty-first to twenty-eighth memory chips 51 to 58. The plurality of second adhesive layers 73 may include an underfill, a DAF, an FOW, or a combination thereof. Each of the plurality of second adhesive layers 73 may have a vertical thickness which is relatively less than that of each of the plurality of first adhesive layers 71.

The plurality of second conductive connections 83 may be disposed between adjacent chips of the first to eighth memory chips 31 to 38 and between first memory chips 31 and the first semiconductor chip 21 and may be disposed between adjacent chips of the twenty-first to twenty-eighth memory chips 51 to 58 and between the twenty-first memory chip 51 and the first semiconductor chip 21. A first set of the plurality of second conductive connections 83 may contact a set of the plurality of second pads 85 and a second set of the plurality of second conductive connections 83 may contact a set of the first pads 25. The plurality of main memory chips 31 to 38 and 51 to 58 may be electrically connected to the first semiconductor chip 21 via the plurality of second pads 85, the plurality of second conductive connections 83, and the plurality of first pads 25. The plurality of second conductive connections 83 may include a bonding wire, a beam lead, a conductive tape, a conductive spacer, a through silicon via, a solder ball, a solder bump, or a combination thereof. In an embodiment, the plurality of second conductive connections 83 may be a bonding wire such as a gold (Au) wire or an Al wire.

Some of the plurality of second conductive connections 83 may be connected between one of the first to eighth memory chips 31 to 38 and the package substrate 11. Some of the plurality of second conductive connections 83 may contact the plurality of second pads 85 and the plurality of first pads 25. The first to eighth memory chips 31 to 38 may be electrically connected to the package substrate 11 via the plurality of second pads 85, the plurality of second conductive connections 83, and the plurality of first pads 25.

Some of the plurality of second conductive connections 83 may be connected between one or the twenty-first to twenty-eighth memory chips 51 to 58 and the package substrate 11. Some of the plurality of second conductive connections 83 may contact the plurality of second pads 85 and the plurality of first pads 25. The twenty-first to twenty-eighth memory chips 51 to 58 may be electrically connected to the package substrate 11 via the plurality of second pads 85, the plurality of second conductive connections 83, and the plurality of first pads 25. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The encapsulant 91 may cover the package substrate 11. The first tower T1, the second tower T2, the first semiconductor chip 21, the first spacer 27, and the second spacer 28 may be disposed in the encapsulant 91.

A horizontal width of the semiconductor package (e.g., in a first direction such as the X direction) according to embodiments of the disclosure may be a first width W1. The first width W1 may be defined as an interval or distance between the first side surface S1 and the second side surface S2. The first width W1 may be determined based the package substrate 11 and/or the encapsulant 91. The first width W1 may be determined based on industry standard. A horizontal width (e.g., in the X direction) of an overlap region (from a top-down view) between the first semiconductor chip 21 and the first memory chip 31 may be a second width W2. A horizontal width (e.g., in the X direction) of an overlap region (from a top-down view) between the twenty-first semiconductor chip 51 and the first memory chip 31 may be substantially the same as the second width W2.

An interval or distance (e.g., in the X direction) between the first side surface S1 and the eighth memory chip 38 (from a top-down view) may be a third width W3. In an embodiment, the first side surface S1 and the second side surface S2 may be determined based on the package substrate 11. The third width W3 may correspond to a minimum distance (e.g., in the X direction and from a top-down view) between the eighth memory chip 38 and an extension line which passes through the first side surface S1 and is perpendicular to a top surface of the package substrate 11 (e.g., in a Z direction). An interval or distance (e.g., in the X direction) between the second side surface S2 and the twenty-eighth memory chip 58 (from a top-down view) may be substantially the same as the third width W3. In an embodiment, the third width W3 may correspond to a minimum interval, in the X direction from a top-down view, between each of the first to eighth memory chips 31 to 38 and the extension line which passes through the first side surface S1 and is perpendicular to the top surface of the package substrate 11.

An interval between the first memory chip 31 and an extension line which passes through a center of the first semiconductor chip 21 and is perpendicular to the top surface of the package substrate 11 may be a fourth width W4. An interval between the twenty-first memory chip 51 and an extension line which passes through the center of the first semiconductor chip 21 and is perpendicular to the top surface of the package substrate 11 may be a fifth width W5. In an embodiment, the fifth width W5 may be substantially the same as the fourth width W4. An interval between the first memory chip 31 and the twenty-first memory chip 51 may be a sixth width W6. In an embodiment, the sixth width W6 may be a sum of the fourth width W4 and the fifth width W5. A horizontal width of the first tower T1 may be a seventh width W7. A horizontal width of the second tower T2 may be substantially the same as the seventh width W7.

The second width W2 may be greater than 0 mm and less than half of the first width W1. In an embodiment, each of the first memory chip 31 and the twenty-first memory chip 51 may overlap upper portions of some corresponding first pads 25 of the plurality of first pads 25 (e.g., in a situation where through substrate vias are used to connect the first semiconductor chip 21 to the package substrate 11). In some embodiments, the second width W2 may be greater than about 0.2 mm and less than half of the first width W1. The third width W3 may be determined based on a limitation of technical reliability. The third width W3 may be greater than 0 mm and equal to or less than the second width W2. In an embodiment, the third width W3 may be greater than about 0.1 mm and less than or equal to the second width W2. In an embodiment, the second width W2 may be greater than or equal to the third width W3 and less than half of the first width W1. Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

Widths of the first through eighth memory chips 31-38 and twenty-first through twenty-eighth memory chips 51-58 in the Y direction may be substantially the same as each other, and may be greater than a width of the first semiconductor chip 21. Widths of the first and second spacers 27 and 28 in the Y direction may be substantially the same as the widths in the Y direction of the first through eighth memory chips 31-38 and twenty-first through twenty-eighth memory chips 51-58, or may be less than the widths in the Y direction of the first through eighth memory chips 31-38 and twenty-first through twenty-eighth memory chips 51-58 and greater than the width in the Y direction of the first semiconductor chip 21.

Portions of the first semiconductor chip, the first spacer 27, and the second spacer 28 that overlap the bottommost memory chips 31 and 51 of the first and second towers T1 and T2 may be described as supports, support portions, or support structures. One side of the first tower T1 may be supported by a support formed of part or all of first spacer 27, and the other side of the first tower T1 may be supported by a support formed of part of the first semiconductor chip 21. One side of the second tower T2 may be supported by a support formed of part or all of second spacer 28, and the other side of the second tower T2 may be supported by a support formed of part of the first semiconductor chip 21.

According to embodiments of the disclosure, a size of the seventh width W7 may be maximized by controlling a size of the second width W2. The number of memory chips equipped in the first tower T1 and the second tower T2 may increase based on enlarging a size of the seventh width W7. The plurality of main memory chips 31 to 38 and 51 to 58 may be electrically connected to the first semiconductor chip 21 via the plurality of second conductive connections 83. A signal transfer path of the semiconductor package according to embodiments of the disclosure may be shortened.

Figure 3:
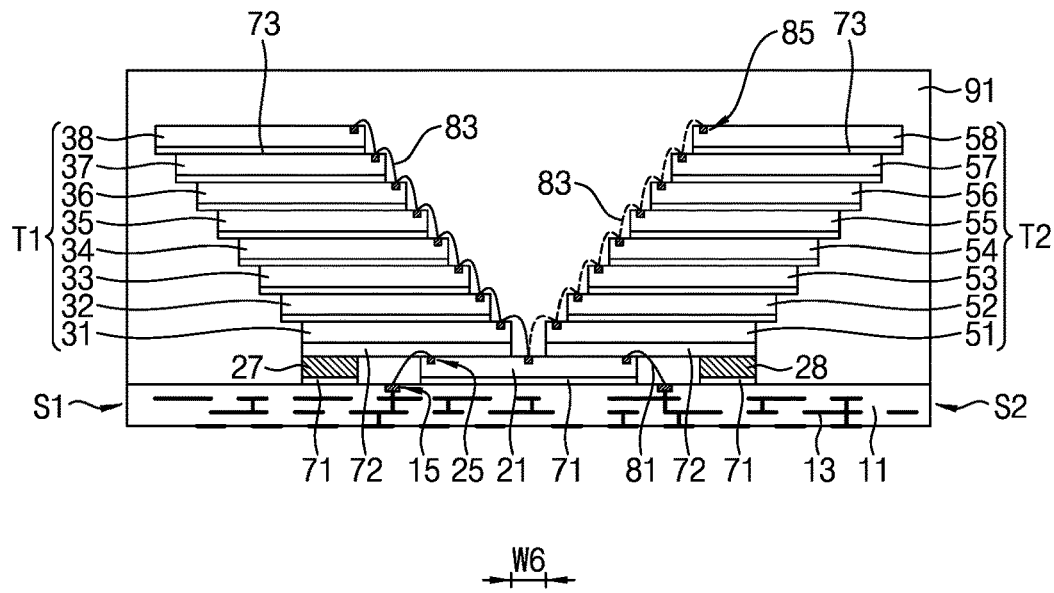
FIG. 3 is a cross-sectional view for describing a semiconductor package according to embodiments of the disclosure.
Figure 4:
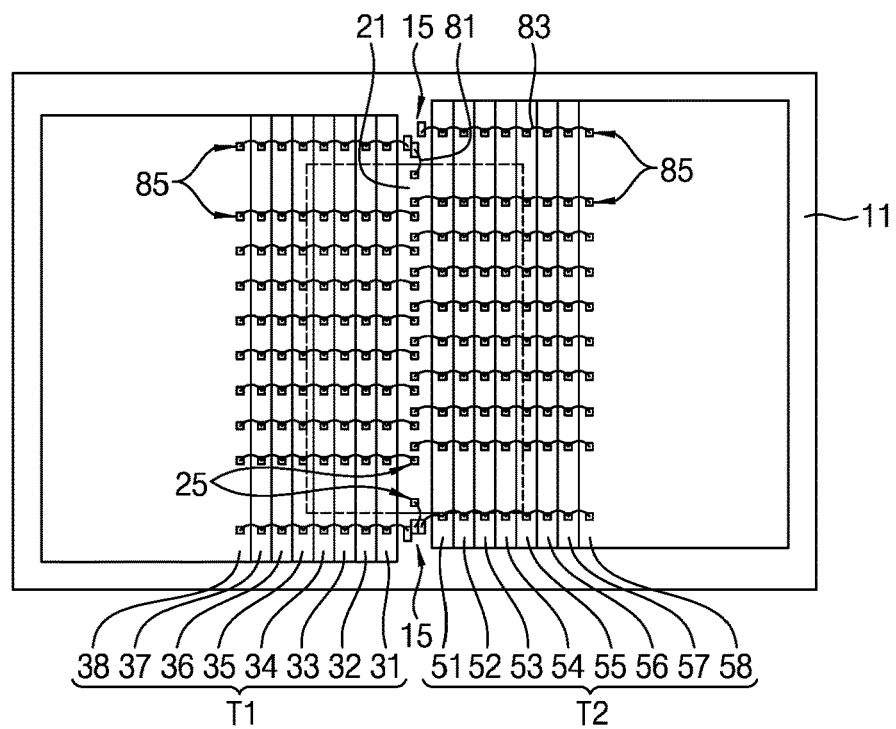
FIG. 4 is a layout for describing a semiconductor package according to embodiments of the disclosure.

FIG. 3 is a cross-sectional view for describing a semiconductor package according to embodiments of the disclosure, and FIG. 4 is a layout for describing a semiconductor package according to embodiments of the disclosure.

Referring to FIGS. 3 and 4, an interval between a first memory chip 31 and a twenty-first memory chip 51 may be a sixth width W6. A minimum value of the sixth width W6 may be determined based on a limitation of technical reliability. In an embodiment, the minimum value of the sixth width W6 may be greater than a horizontal width of each of a plurality of first pads 25. The minimum value of the sixth width W6 may be greater than about 0.1 mm.

FIGS. 5 to 8 are cross-sectional views for describing methods of manufacturing a semiconductor package, according to embodiments of the disclosure.

Figure 5:
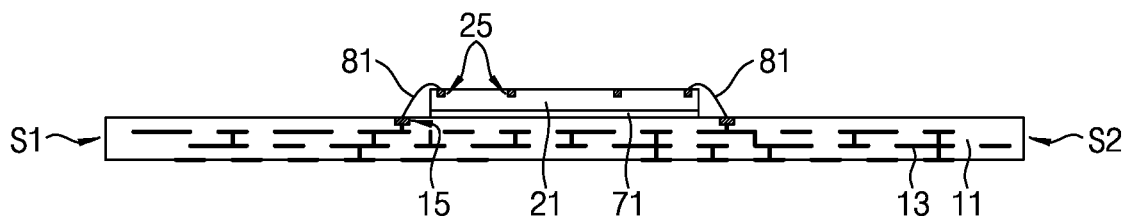
FIGS. 5 to 8 are cross-sectional views for describing methods of manufacturing a semiconductor package, according to embodiments of the disclosure.

Referring to FIG. 5, the methods of manufacturing a semiconductor package according to embodiments of the disclosure may include a process of mounting a first semiconductor chip 21 on a package substrate 11 including a first side surface 51 and a second side surface S2 by using a substrate adhesive layer 71. A plurality of first conductive connections 81 may be formed between a plurality of first pads 25 of the first semiconductor chip 21 and a plurality of substrate pads 15 of the package substrate 11. Though the first conductive connections 81 are depicted as bonding wires, in some embodiments, they may be through substrate vias.

Figure 6:
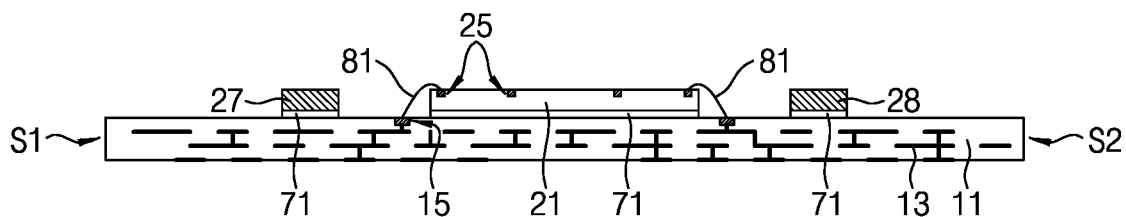

Referring to FIG. 6, a first spacer 27 and a second spacer 28 may be attached on the package substrate 11 by using the substrate adhesive layer 71.

Figure 7:
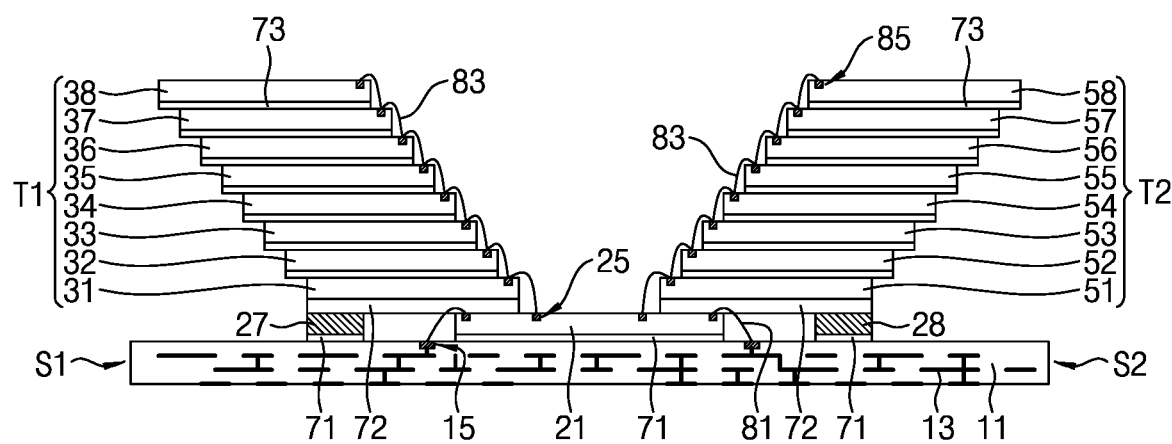

Referring to FIG. 7, a first tower T1 and a second tower T2 apart from each other may be disposed on the first semiconductor chip 21, the first spacer 27, and the second spacer 28. A plurality of first adhesive layers 72 may be attached between a first memory chip 31 and the first semiconductor chip 21, between the first memory chip 31 and the first spacer 27, between the twenty-first memory chip 51 and the first semiconductor chip 21, and between the twenty-first memory chip 51 and the second spacer 28. In some embodiments (e.g., if wire bonding is used), the plurality of first conductive connections 81 may partially pass through the plurality of first adhesive layers 72. For example, the first adhesive layers 72 may be a DAF or FOW.

A plurality of second adhesive layers 73 may be attached between each chip of the first to eighth memory chips 31 to 38 and between the first memory chip 31 and the first semiconductor chip 21, and between each chip of the twenty-first to twenty-eighth memory chips 51 to 58 and between the twenty-first memory chip 51 and the first semiconductor chip 21. The plurality of second conductive connections 83 may be formed between the first to eighth memory chips 31 to 38 and the first semiconductor chip 21 and between the twenty-first to twenty-eighth memory chips 51 to 58 and the first semiconductor chip 21. Each of the plurality of second conductive connections 83 may contact a pair of second pads 85 of the plurality of second pads 85, or may contact a second pad 85 of the plurality of second pads 85 and a first pad 25 of the plurality of first pads 25.

Figure 8:
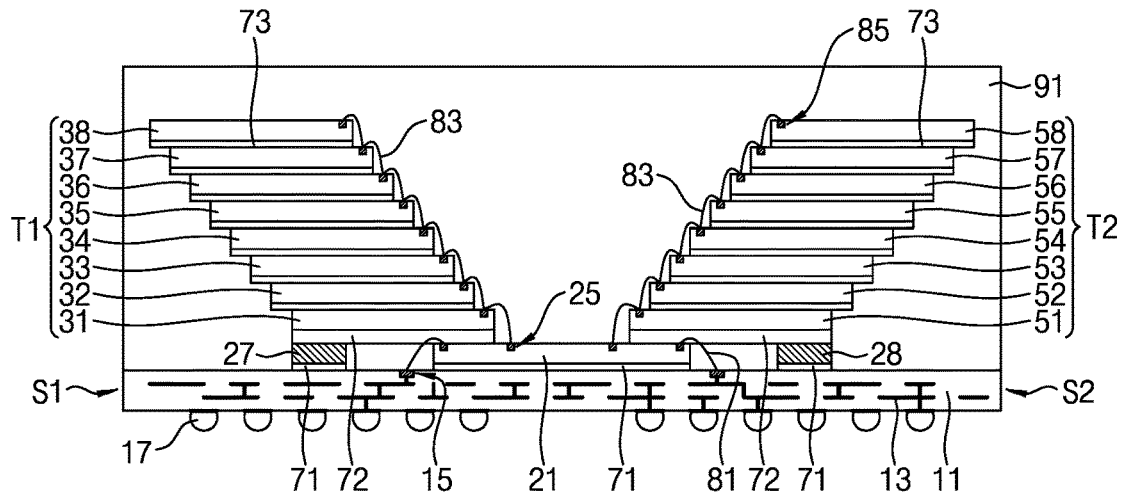

Referring to FIG. 8, an encapsulant 91 covering the package substrate 11 is formed. The encapsulant 91 may include an epoxy molding compound, for example. A plurality of external terminals 17 may then be formed on one surface (for example, a bottom surface) of the package substrate 11. The plurality of external terminals 17 may be connected to a plurality of substrate wirings 13. The plurality of external terminals 17 may include, for example, solder balls, solder bumps, a pin grid array, a lead grid array, conductive taps, or combinations thereof. In an embodiment, the plurality of external terminals 17 may be omitted.

FIGS. 9 to 15 are cross-sectional views for describing a semiconductor package according to embodiments of the disclosure.

Figure 9:
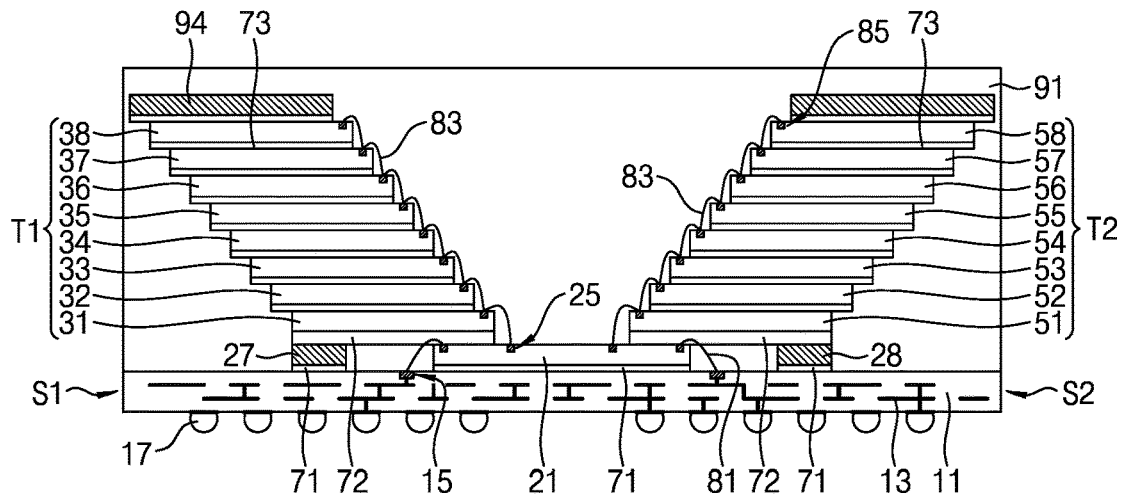
FIGS. 9 to 15 are cross-sectional views for describing a semiconductor package according to embodiments of the disclosure.

Referring to FIG. 9, a semiconductor package according to embodiments of the disclosure may include a package substrate 11, a first semiconductor chip 21, a first spacer 27, a second spacer 28, a plurality of main memory chips 31 to 38 and 51 to 58, a plurality of substrate adhesive layers 71, a plurality of first adhesive layers 72, a plurality of second adhesive layers 73, a plurality of first conductive connections 81, a plurality of second conductive connections 83, an encapsulant 91, and a plurality of dummy chips 94.

In an embodiment, the plurality of dummy chips 94 may be disposed on an eighth memory chip 38 and a twenty-eighth memory chip 58. Each of the plurality of dummy chips 94 may include a size and a configuration which are similar to those of each of the plurality of main memory chips 31 to 38 and 51 to 58. The plurality of dummy chips 94 may disperse stresses of the plurality of main memory chips 31 to 38 and 51 to 58. Each of the plurality of dummy chips 94 may act as a heat dissipation plate. The plurality of dummy chips 94 may be disposed in the encapsulant 91. In an embodiment, the plurality of dummy chips 94 may be exposed at a side surface and/or a top surface of the encapsulant 91. In one embodiment, the plurality of dummy chips are not communicatively connected to any other of the chips in each tower.

Figure 10:
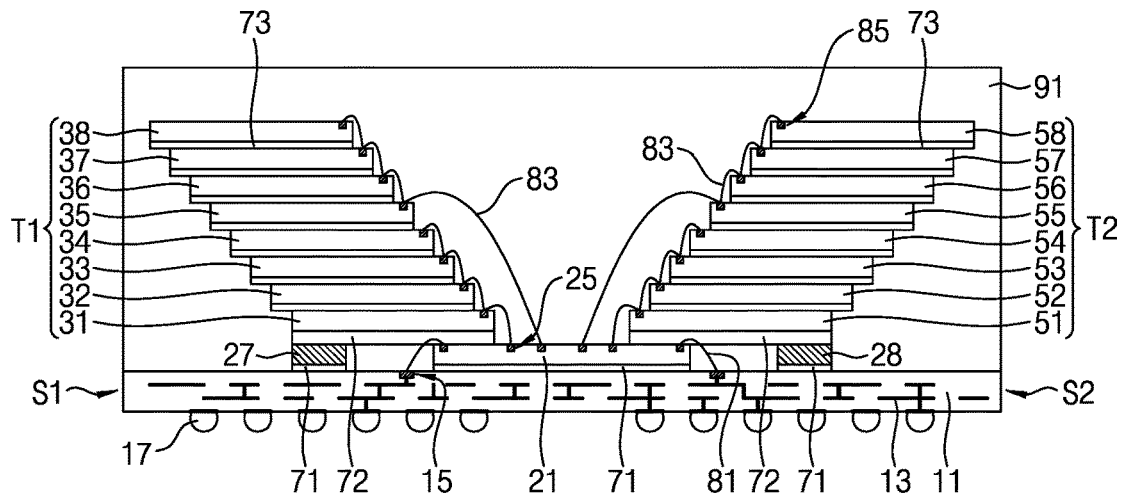

Referring to FIG. 10, a first memory chip 31, a second memory chip 32, a third memory chip 33, and a fourth memory chip 34 may be connected to at least one corresponding first pad 25 of a plurality of first pads 25 of the first semiconductor chip 21 by using at least one second conductive connection 83 selected from among a plurality of second conductive connections 83. A fifth memory chip 35, a sixth memory chip 36, a seventh memory chip 37, and an eighth memory chip 38 may be connected to at least one other corresponding first pad 25 of the plurality of first pads 25 of the first semiconductor chip 21 by using at least one other second conductive connection 83 selected from among the plurality of second conductive connections 83.

A twenty-first memory chip 51, a twenty-second memory chip 52, a twenty-third memory chip 53, and a twenty-fourth memory chip 54 may be connected to at least one other corresponding first pad 25 of the plurality of first pads 25 of the first semiconductor chip 21 by using at least one other second conductive connection 83 selected from among the plurality of second conductive connections 83. A twenty-fifth memory chip 55, a twenty-sixth memory chip 56, a twenty-seventh memory chip 57, and a twenty-eighth memory chip 58 may be connected to at least one other corresponding first pad 25 of the plurality of first pads 25 of the first semiconductor chip 21 by using at least one other second conductive connection 83 selected from among the plurality of second conductive connections 83.

Figure 11:
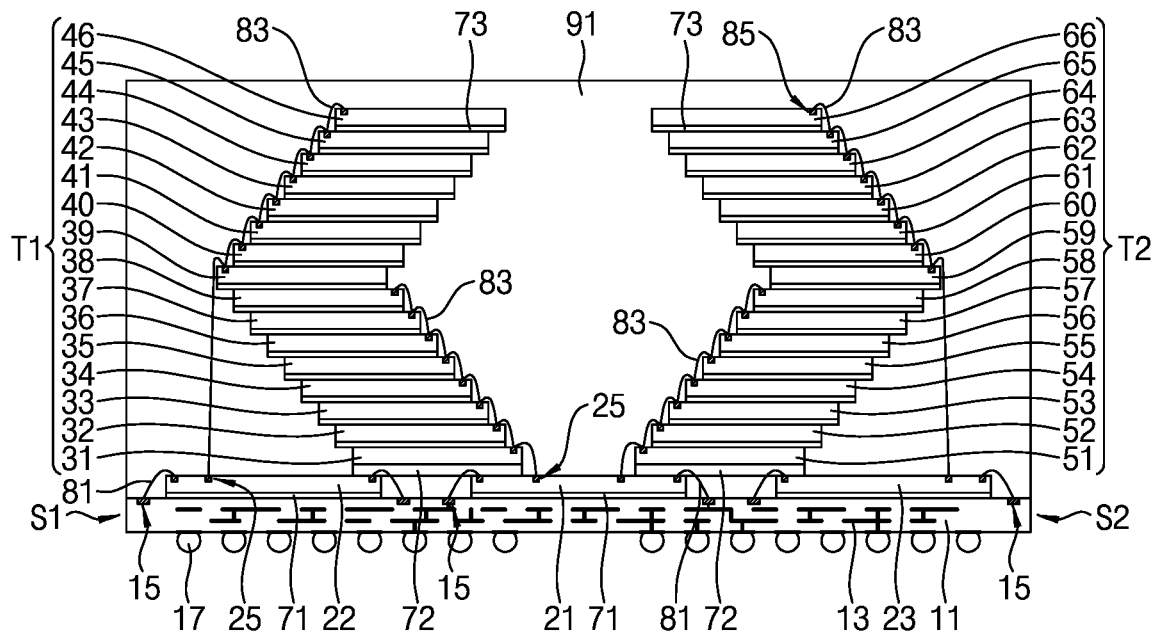

Referring to FIG. 11, a semiconductor package according to embodiments of the disclosure may include a package substrate 11, a first semiconductor chip 21, a second semiconductor chip 22, a third semiconductor chip 23, a plurality of main memory chips 31 to 46 and 51 to 66, a plurality of substrate adhesive layers 71, a plurality of first adhesive layers 72, a plurality of second adhesive layers 73, a plurality of first conductive connections 81, a plurality of second conductive connections 81, and an encapsulant 91. Each of the second semiconductor chip 22 and the third semiconductor chip 23 may include a configuration which is similar to that of the first semiconductor chip 21.

The plurality of substrate adhesive layers 71 may be attached between the first semiconductor chip 21 and the package substrate 11, between the second semiconductor chip 22 and the package substrate 11, and between the third semiconductor chip 23 and the package substrate 11. Top surfaces of the first semiconductor chip 21, the second semiconductor chip 22, and the third semiconductor chip 23 may be substantially coplanar with one another. The second semiconductor chip 22 may be disposed between the first semiconductor chip 21 and a first side surface S1 of the semiconductor package. The third semiconductor chip 23 may be disposed between the first semiconductor chip 21 and a second side surface S2 of the semiconductor package.

The plurality of first conductive connections 81 may be respectively connected between the package substrate 11 and the first semiconductor chip 21, the second semiconductor chip 22, and the third semiconductor chip 23. The plurality of first conductive connections 81 may contact the plurality of first pads 25 and the plurality of substrate pads 15. Each of the first semiconductor chip 21, the second semiconductor chip 22, and the third semiconductor chip 23 may be electrically connected to the package substrate 11 via the plurality of first pads 25, the plurality of first conductive connections 81, and the plurality of substrate pads 15.

A first tower T1 may overlap the first semiconductor chip 21 and the second semiconductor chip 22, from a top-down view. The first tower T1 may include a first memory chip 31, a second memory chip 32, a third memory chip 33, a fourth memory chip 34, a fifth memory chip 35, a sixth memory chip 36, a seventh memory chip 37, an eighth memory chip 38, a ninth memory chip 39, a tenth memory chip 40, an eleventh memory chip 41, a twelfth memory chip 42, a thirteenth memory chip 43, a fourteenth memory chip 44, a fifteenth memory chip 45, and a sixteenth memory chip 46. The first to sixteenth memory chips 31 to 46 may be sequentially stacked. The first to eighth memory chips 31 to 38 may be offset-aligned sequentially in a direction toward the first side surface S1, such that they are stacked sequentially in an upward staircase manner in the direction toward the first side surface S1. The ninth to sixteenth memory chips 39 to 46 may be offset-aligned sequentially in a direction toward the second side surface S2, such that they are stacked sequentially in an upward staircase manner in the direction toward the second side surface S2.

A second tower T2 may overlap the first semiconductor chip 21 and the third semiconductor chip 23 from a top-down view. The second tower T2 may include a twenty-first memory chip 51, a twenty-second memory chip 52, a twenty-third memory chip 53, a twenty-fourth memory chip 54, a twenty-fifth memory chip 55, a twenty-sixth memory chip 56, a twenty-seventh memory chip 57, a twenty-eighth memory chip 58, a twenty-ninth memory chip 59, a thirtieth memory chip 60, a thirty-first memory chip 61, a thirty-second memory chip 62, a thirty-third memory chip 63, a thirty-fourth memory chip 64, a thirty-fifth memory chip 65, and a thirty-sixth memory chip 66. The twenty-first to thirty-sixteenth memory chips 51 to 66 may be sequentially stacked. The twenty-first to twenty-eighth memory chips 51 to 58 may be offset-aligned sequentially in a direction toward the second side surface S2, such that they are stacked sequentially in an upward staircase manner in the direction toward the second side surface S2. The twenty-ninth to thirty-sixth memory chips 59 to 66 may be offset-aligned sequentially in a direction toward the first side surface S1, such that they are stacked sequentially in an upward staircase manner in the direction toward the first side surface S1.

The first memory chip 31 may overlap the first semiconductor chip 21 and the second semiconductor chip 22 from a top-down view. The twenty-first memory chip 51 may overlap the first semiconductor chip 21 and the third semiconductor chip 23 from a top-down view. In addition to be electrically and communicatively connected to the two towers T1 and T2 respectively, the second semiconductor chip 22 and third semiconductor chip 23 may serve as a physical support structure, and may each be described as a support or support structure, or as including a support portion. The plurality of first adhesive layers 72 may be attached between the first memory chip 31 and the first semiconductor chip 21, between the first memory chip 31 and the second semiconductor chip 22, between the twenty-first memory chip 51 and the first semiconductor chip 21, and between the twenty-first memory chip 51 and the third semiconductor chip 23. The plurality of second adhesive layers 73 may be attached between the first to sixteenth memory chips 31 to 46 and the twenty-first to thirty-sixth memory chips 51 to 66.

The plurality of second conductive connectors 83 may be disposed between the first to eighth memory chips 31 to 38 and the first semiconductor chip 21, between the ninth to sixteenth memory chips 39 to 46 and the second semiconductor chip 22, between the twenty-first to twenty-eighth memory chips 51 to 58 and the first semiconductor chip 21, and between the twenty-first to thirty-sixth memory chips 51 to 66 and the third semiconductor chip 23.

Figure 12:
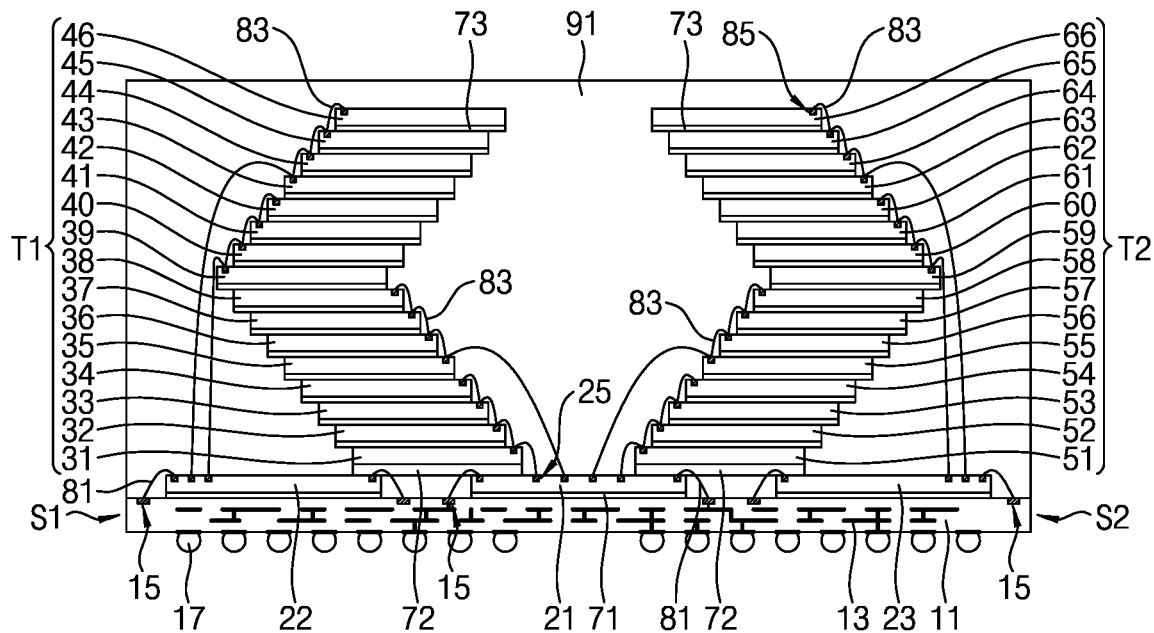

Referring to FIG. 12, a first memory chip 31, a second memory chip 32, a third memory chip 33, and a fourth memory chip 34 may be connected to at least one corresponding first pad 25 of a plurality of first pads 25 of the first semiconductor chip 21 by using at least one second conductive connection 83 selected from among a plurality of second conductive connections 83. A fifth memory chip 35, a sixth memory chip 36, a seventh memory chip 37, and an eighth memory chip 38 may be connected to at least one other corresponding first pad 25 of the plurality of first pads 25 of the first semiconductor chip 21 by using at least one other second conductive connection 83 selected from among the plurality of second conductive connections 83.

A ninth memory chip 39, a tenth memory chip 40, an eleventh memory chip 41, and a twelfth fourth memory chip 42 may be connected to at least one corresponding first pad 25 of a plurality of first pads 25 of the second semiconductor chip 22 by using at least one second conductive connection 83 selected from among the plurality of second conductive connections 83. A thirteenth memory chip 43, a fourteenth memory chip 44, a fifteenth memory chip 45, and a sixteenth memory chip 46 may be connected to at least one other corresponding first pad 25 of the plurality of first pads 25 of the second semiconductor chip 22 by using at least one other second conductive connection 83 selected from among the plurality of second conductive connections 83.

A twenty-first memory chip 51, a twenty-second memory chip 52, a twenty-third memory chip 53, and a twenty-fourth memory chip 54 may be connected to at least one other corresponding first pad 25 of the plurality of first pads 25 of the first semiconductor chip 21 by using at least one other second conductive connection 83 selected from among the plurality of second conductive connections 83. A twenty-fifth memory chip 55, a twenty-sixth memory chip 56, a twenty-seventh memory chip 57, and a twenty-eighth memory chip 58 may be connected to at least one other corresponding first pad 25 of the plurality of first pads 25 of the first semiconductor chip 21 by using at least one other second conductive connection 83 selected from among the plurality of second conductive connections 83.

A twenty-ninth memory chip 59, a thirty memory chip 60, a thirty-first memory chip 61, and a thirty-second memory chip 62 may be connected to at least one corresponding first pad 25 of a plurality of first pads 25 of the third semiconductor chip 23 by using at least one other second conductive connection 83 selected from among the plurality of second conductive connections 83. A thirty-third memory chip 63, a thirty-fourth memory chip 64, a thirty-fifth memory chip 65, and a thirty-sixth memory chip 66 may be connected to at least one other corresponding first pad 25 of the plurality of first pads 25 of the third semiconductor chip 23 by using at least one other second conductive connection 83 selected from among the plurality of second conductive connections 83.

Figure 13:
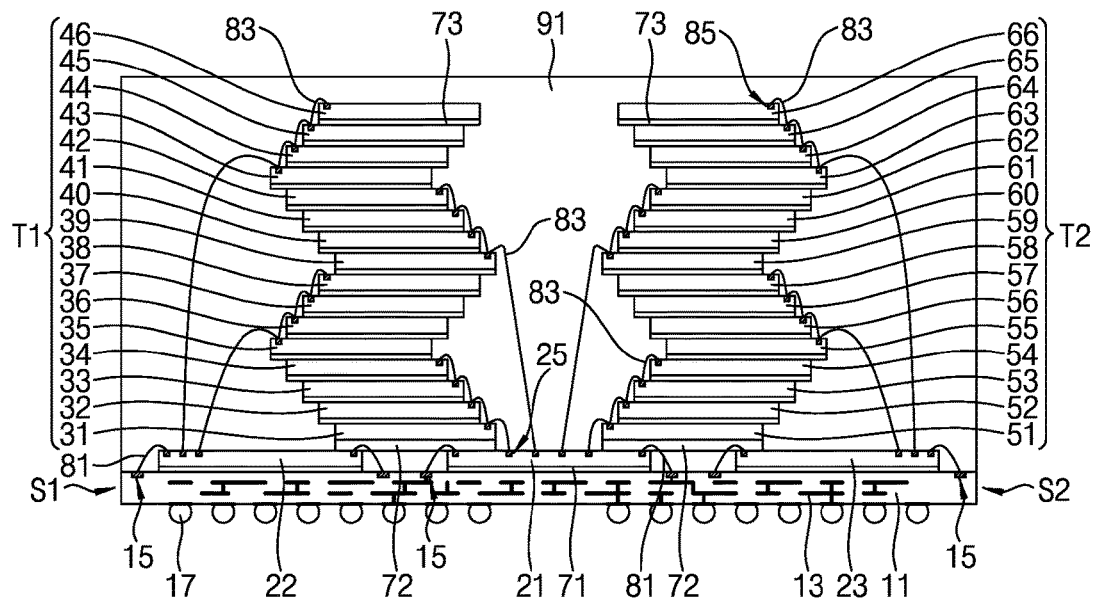

Referring to FIG. 13, a first memory chip 31, a second memory chip 32, a third memory chip 33, and a fourth memory chip 34 may be offset-aligned sequentially in a direction toward a first side surface S1 of a semiconductor package according to embodiments of the disclosure. The first memory chip 31, the second memory chip 32, the third memory chip 33, and the fourth memory chip 34 may be connected to at least one corresponding first pad 25 of a plurality of first pads 25 of a first semiconductor chip 21 by using at least one second conductive connection 83 selected from among a plurality of second conductive connections 83.

A fifth memory chip 35, a sixth memory chip 36, a seventh memory chip 37, and an eighth memory chip 38 may be offset-aligned sequentially in a direction toward a second side surface S2 of the semiconductor package according to embodiments of the disclosure. The fifth memory chip 35, the sixth memory chip 36, the seventh memory chip 37, and the eighth memory chip 38 may be connected to at least one corresponding first pad 25 of a plurality of first pads 25 of a second semiconductor chip 22 by using at least one other second conductive connection 83 selected from among the plurality of second conductive connections 83.

A ninth memory chip 39, a tenth memory chip 40, an eleventh memory chip 41, and a twelfth fourth memory chip 42 may be offset-aligned sequentially in a direction toward the first side surface S1 of the semiconductor package according to embodiments of the disclosure. The ninth memory chip 39, the tenth memory chip 40, the eleventh memory chip 41, and the twelfth fourth memory chip 42 may be connected to at least one other corresponding first pad 25 of the plurality of first pads 25 of the first semiconductor chip 21 by using at least one other second conductive connection 83 selected from among the plurality of second conductive connections 83.

A thirteenth memory chip 43, a fourteenth memory chip 44, a fifteenth memory chip 45, and a sixteenth memory chip 46 may be offset-aligned sequentially in a direction toward the second side surface S2 of the semiconductor package according to embodiments of the disclosure. The thirteenth memory chip 43, the fourteenth memory chip 44, the fifteenth memory chip 45, and the sixteenth memory chip 46 may be connected to at least one other corresponding first pad 25 of the plurality of first pads 25 of the second semiconductor chip 22 by using at least one other second conductive connection 83 selected from among the plurality of second conductive connections 83.

A twenty-first memory chip 51, a twenty-second memory chip 52, a twenty-third memory chip 53, and a twenty-fourth memory chip 54 may be offset-aligned sequentially in a direction toward the second side surface S2 of the semiconductor package according to embodiments of the disclosure. The twenty-first memory chip 51, the twenty-second memory chip 52, the twenty-third memory chip 53, and the twenty-fourth memory chip 54 may be connected to at least one other corresponding first pad 25 of the plurality of first pads 25 of the first semiconductor chip 21 by using at least one other second conductive connection 83 selected from among the plurality of second conductive connections 83.

A twenty-fifth memory chip 55, a twenty-sixth memory chip 56, a twenty-seventh memory chip 57, and a twenty-eighth memory chip 58 may be offset-aligned sequentially in a direction toward the first side surface S1 of the semiconductor package according to embodiments of the disclosure. The twenty-fifth memory chip 55, the twenty-sixth memory chip 56, the twenty-seventh memory chip 57, and the twenty-eighth memory chip 58 may be connected to at least one corresponding first pad 25 of a plurality of first pads 25 of a third semiconductor chip 23 by using at least one other second conductive connection 83 selected from among the plurality of second conductive connections 83.

A twenty-ninth memory chip 59, a thirtieth memory chip 60, a thirty-first memory chip 61, and a thirty-second memory chip 62 may be offset-aligned sequentially in a direction toward the second side surface S2 of the semiconductor package according to embodiments of the disclosure. The twenty-ninth memory chip 59, the thirtieth memory chip 60, the thirty-first memory chip 61, and the thirty-second memory chip 62 may be connected to at least one other corresponding first pad 25 of the plurality of first pads 25 of the first semiconductor chip 21 by using at least one other second conductive connection 83 selected from among the plurality of second conductive connections 83.

A thirty-third memory chip 63, a thirty-fourth memory chip 64, a thirty-fifth memory chip 65, and a thirty-sixth memory chip 66 may be offset-aligned sequentially in a direction toward the first side surface S1 of the semiconductor package according to embodiments of the disclosure. The thirty-third memory chip 63, the thirty-fourth memory chip 64, the thirty-fifth memory chip 65, and the thirty-sixth memory chip 66 may be connected to at least one other corresponding first pad 25 of the plurality of first pads 25 of the third semiconductor chip 23 by using at least one other second conductive connection 83 selected from among the plurality of second conductive connections 83.

Figure 14:
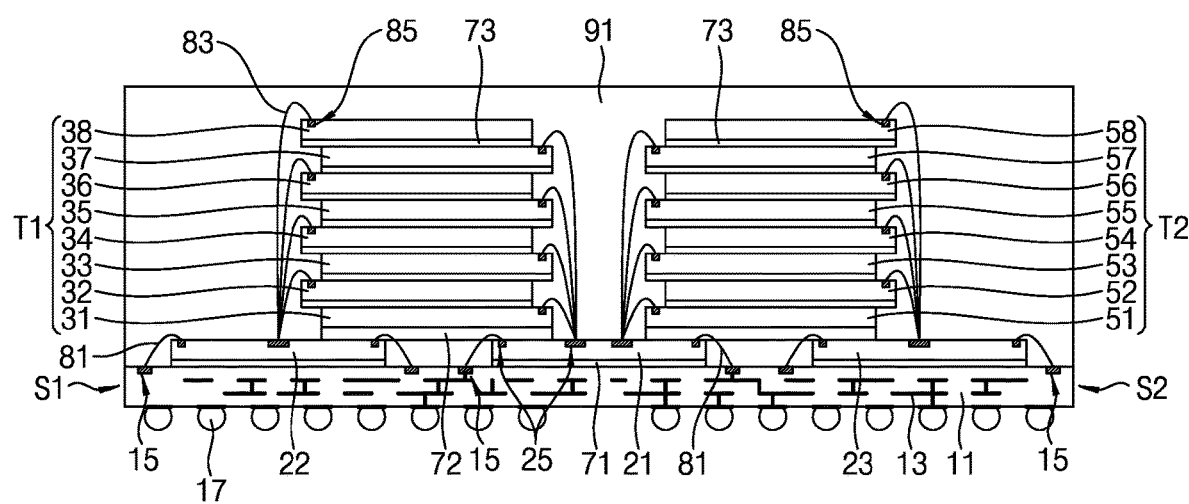

Referring to FIG. 14, first to eighth memory chips 31 to 38 may be zigzag-stacked on a first memory chip 21 and a second memory chip 22. Twenty-first to twenty-eighth memory chips 51 to 58 may be zigzag-stacked on the first memory chip 21 and a third memory chip 23. For example, the second memory chip 32 may be offset-aligned on the first memory chip 31 in a direction toward a first side surface S1 of a semiconductor package according to embodiments of the disclosure. The third memory chip 33 may be offset-aligned on the second memory chip 32 in a direction toward a second side surface S2 of the semiconductor package according to embodiments of the disclosure. The twenty-second memory chip 52 may be offset-aligned on the twenty-first memory chip 51 in a direction toward the second side surface S2 of the semiconductor package according to embodiments of the disclosure. The twenty-third memory chip 53 may be offset-aligned on the twenty-second memory chip 52 in a direction toward the first side surface S1 of the semiconductor package according to embodiments of the disclosure.

The first memory chip 31, the third memory chip 33, the fifth memory chip 35, and the seventh memory chip 37 may be connected to at least one corresponding first pad 25 of a plurality of first pads 25 of the first semiconductor chip 21 by using a plurality of second conductive connections 83. The second memory chip 32, the fourth memory chip 34, the sixth memory chip 36, and the eighth memory chip 38 may be connected to at least one corresponding first pad 25 of a plurality of first pads 25 of the second semiconductor chip 22 by using the plurality of second conductive connections 83.

The twenty-first memory chip 51, the twenty-third memory chip 53, the twenty-fifth memory chip 55, and the twenty-seventh memory chip 57 may be connected to at least one corresponding first pad 25 of a plurality of first pads 25 of the first semiconductor chip 21 by using a plurality of second conductive connections 83. The twenty-second memory chip 52, the twenty-fourth memory chip 54, the twenty-sixth memory chip 56, and the twenty-eighth memory chip 58 may be connected to at least one corresponding first pad 25 of a plurality of first pads 25 of the third semiconductor chip 23 by using the plurality of second conductive connections 83.

Figure 15:
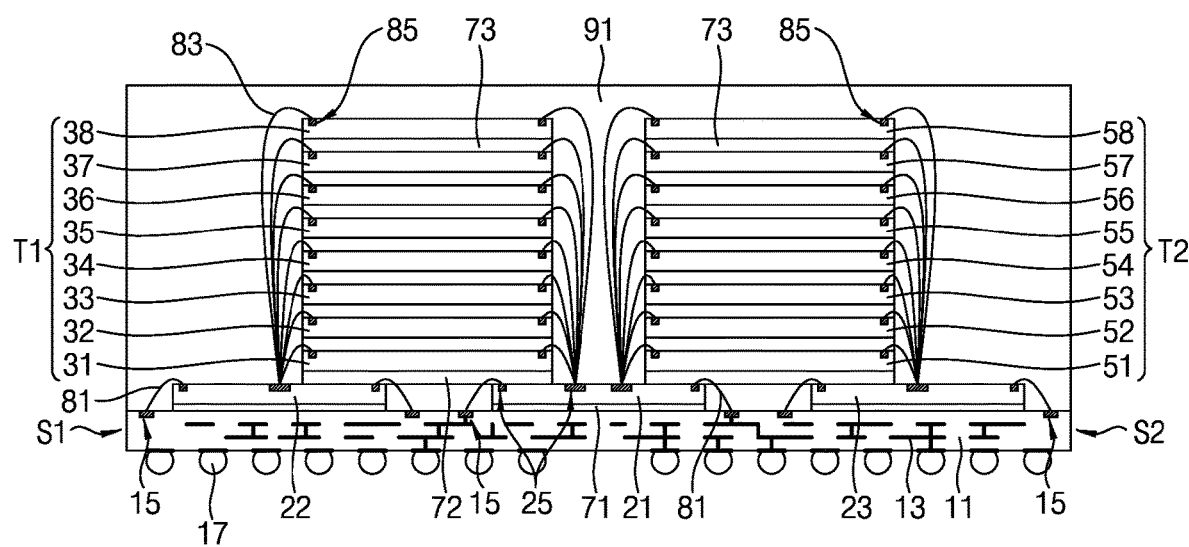

Referring to FIG. 15, first to eighth memory chips 31 to 38 may be stacked on a first memory chip 21 and a second memory chip 22 and may overhang each of the first memory chip 21 and the second memory chip 22. Twenty-first to twenty-eighth memory chips 51 to 58 may be stacked on the first memory chip 21 and a third memory chip 23 and may overhang each of the first memory chip 21 and the third memory chip 23. For example, the first to eighth memory chips 31 to 38 may be vertically aligned to have coplanar side surfaces. The twenty-first to twenty-eighth memory chips 51 to 58 may be vertically aligned to have coplanar side surfaces.

A plurality of second adhesive layers 73 may be attached between the first to eighth memory chips 31 to 38 and between the twenty-first to twenty-eighth memory chips 51 to 58. Each of the plurality of second adhesive layers 73 may include substantially the same thickness and substantially the same material as those of each of a plurality of first adhesive layers 72. The plurality of first adhesive layers 72 and the plurality of second adhesive layers 73 may include a DAF or an FOW.

Each of the first to eighth memory chips 31 to 38 may be connected to at least one corresponding first pad 25 of a plurality of first pads 25 of the first semiconductor chip 21 by using a plurality of second conductive connections 83. Each of the first to eighth memory chips 31 to 38 may be connected to at least one corresponding first pad 25 of a plurality of first pads 25 of the second semiconductor chip 22 by using the plurality of second conductive connections 83.

Each of the twenty-first to twenty-eighth memory chips 51 to 58 may be connected to at least one other corresponding first pad 25 of the plurality of first pads 25 of the first semiconductor chip 21 by using the plurality of second conductive connections 83. Each of the twenty-first to twenty-eighth memory chips 51 to 58 may be connected to at least one corresponding first pad 25 of a plurality of first pads 25 of the third semiconductor chip 23 by using the plurality of second conductive connections 83. The plurality of second conductive connections 83 may extend to inner portions of the plurality of second adhesive layers 73. The plurality of second conductive connections 83 may partially pass through the plurality of second adhesive layers 73.

According to the embodiments of the disclosure, a plurality of towers which include a plurality of main memory chips and are apart from one another may be provided. A lowermost main memory chip of each of the plurality of towers may overlap a semiconductor chip. A semiconductor package, which is easy to increase the degree of integration and an operating speed, may be implemented.

Hereinabove, the embodiments of the disclosure have been described with reference to the accompanying drawings, but it may be understood that those skilled in the art may implement the embodiments in another detailed form without changing the inventive concept or the essential feature. It should be understood that the embodiments described above are merely examples in all aspects and are not limited.

What is claimed is:

1. A semiconductor package comprising:
a package substrate;
a semiconductor chip on the package substrate;
a plurality of first conductive connections connecting the semiconductor chip to the package substrate;
a first spacer and a second spacer on the package substrate, each of the first spacer and the second spacer horizontally spaced apart from the semiconductor chip;
a first tower and a second tower each including a plurality of memory chips, a first memory chip disposed at a lowermost end of the first tower and vertically overlapping the semiconductor chip and the first spacer from a top-down view, and a second memory chip disposed at a lowermost end of the second tower and vertically overlapping the semiconductor chip and the second spacer from a top-down view; and
a plurality of first adhesive layers including an adhesive layer attached between the first memory chip and the semiconductor chip, an adhesive layer attached between the first memory chip and the first spacer, an adhesive layer attached between the second memory chip and the semiconductor chip, and an adhesive layer attached between the second memory chip and the second spacer.

2. The semiconductor package of claim 1, wherein
a horizontal width of the package substrate is a first width,
a horizontal width of an overlap region between the first memory chip and the semiconductor chip is a second width, and
the second width is less than half of the first width.

3. The semiconductor package of claim 2, wherein the second width is about 0.2 mm or more.

4. The semiconductor package of claim 2, wherein
the package substrate comprises a first side surface and a second side surface opposite to the first side surface,
a minimum horizontal distance between any of the plurality of memory chips and an extension line which passes through the first side surface and is perpendicular to a top surface of the package substrate is a third width, and
the third width is greater than 0 mm and less than or equal to the second width.

5. The semiconductor package of claim 4, wherein the second width is greater than or equal to the third width.

6. The semiconductor package of claim 1, wherein
the semiconductor chip comprises a plurality of pads, and
each of the first memory chip and the second memory chip overlaps an upper portion of at least one of the plurality of pads, from a top-down view.

7. The semiconductor package of claim 1, wherein at least some of the plurality of first conductive connections extend to be within an inner boundary formed by the plurality of first adhesive layers.

8. The semiconductor package of claim 1, wherein the plurality of first adhesive layers comprise a direct adhesive film (DAF) or a film over wire (FOW).

9. The semiconductor package of claim 1, wherein
the package substrate comprises a first side surface and a second side surface opposite to the first side surface,
the plurality of memory chips of the first tower are stacked sequentially and in an upward staircase manner in a direction toward the first side surface, and
the plurality of memory chips of the second tower are stacked sequentially and in an upward staircase manner in a direction toward the second side surface.

10. The semiconductor package of claim 1, wherein
a side surface of the first memory chip and a side surface of the first spacer are coplanar with each other, and
a side surface of the second memory chip and a side surface of the second spacer are coplanar with each other.

11. The semiconductor package of claim 1, wherein the semiconductor chip and top surfaces of the first and second spacers are coplanar with each other.

12. The semiconductor package of claim 1, wherein the semiconductor chip comprises a buffer chip, an interposer chip, a controller chip, a logic chip, or a combination thereof.

13. The semiconductor package of claim 1, further comprising a plurality of second conductive connections connecting the plurality of memory chips to the semiconductor chip.

14. The semiconductor package of claim 1, further comprising a plurality of second adhesive layers disposed between pairs of the plurality of memory chips, wherein a thickness of each of the plurality of first adhesive layers is thicker than a thickness of each of the plurality of second adhesive layers.

15. A semiconductor package comprising:
a package substrate;
a semiconductor chip on the package substrate;
a plurality of conductive connections connecting the semiconductor chip to the package substrate;
a plurality of towers apart from one another, each including a plurality of memory chips, a lowermost memory chip of each of the plurality of towers overlapping the semiconductor chip from a top-down view; and
a plurality of adhesive layers attached between the lowermost memory chip of each of the plurality of towers and the semiconductor chip.

16. The semiconductor package of claim 15, wherein the plurality of conductive connections extend to be within an inner boundary formed by the plurality of adhesive layers.

17. The semiconductor package of claim 15, wherein:
the plurality of towers includes at least a first tower, wherein a bottom-most surface of the first tower overlaps the semiconductor chip and extends beyond an outermost edge of a top surface of the semiconductor chip.

18. The semiconductor package of claim 15, wherein:
the package substrate comprises a first side surface and a second side surface opposite to the first side surface,
a plurality of memory chips of a first tower of the plurality of towers are stacked sequentially and in an upward staircase manner in a direction toward the first side surface, and
a plurality of memory chips of a second tower of the plurality of towers are stacked sequentially and in an upward staircase manner in a direction toward the second side surface.

19. A semiconductor package comprising:
a package substrate;
a first semiconductor chip, a second semiconductor chip, and a third semiconductor chip on the package substrate, horizontally spaced apart from each other;
a plurality of first conductive connections connecting the first to third semiconductor chips to the package substrate;
a first tower and a second tower each including a plurality of memory chips, a first memory chip disposed at a lowermost end of the first tower overlapping the first semiconductor chip and the second semiconductor chip from a top-down view, and a second memory chip disposed at a lowermost end of the second tower overlapping the first semiconductor chip and the third semiconductor chip from a top-down view; and
a plurality of first adhesive layers attached respectively between the first memory chip and the first semiconductor chip, between the first memory chip and the second semiconductor chip, between the second memory chip and the first semiconductor chip, and between the second memory chip and the third semiconductor chip.

20. The semiconductor package of claim 19, wherein
the package substrate comprises a first side surface and a second side surface opposite to the first side surface,
the plurality of memory chips of the first tower are stacked sequentially, some of the plurality of memory chips of the first tower are stacked sequentially in an upward staircase manner in a direction toward the first side surface, and some other memory chips of the plurality of memory chips of the first tower are stacked sequentially in an upward staircase manner in a direction toward the second side surface, and
the plurality of memory chips of the second tower are stacked sequentially, some of the plurality of memory chips of the second tower are stacked sequentially in an upward staircase manner in a direction toward the second side surface, and some other memory chips of the plurality of memory chips of the second tower are stacked sequentially in an upward staircase manner in a direction toward the first side surface.

* * * * *